(12) United States Patent
Chang et al.

(10) Patent No.: US 11,316,428 B2
(45) Date of Patent: Apr. 26, 2022

(54) TIME SIGNAL GENERATING CIRCUIT OF POWER CONVERTER AND CONTROL METHOD THEREOF

(71) Applicant: uPI Semiconductor Corp., Hsinchu County (TW)

(72) Inventors: Chih-Lien Chang, Hsinchu County (TW); Chun-Chieh Wang, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 70 days.

(21) Appl. No.: 17/074,650

(22) Filed: Oct. 20, 2020

(65) Prior Publication Data

US 2021/0194363 A1 Jun. 24, 2021

(30) Foreign Application Priority Data

Dec. 18, 2019 (CN) .......................... 201911312403.9

(51) Int. Cl.
*H02M 3/157* (2006.01)
*H03K 5/26* (2006.01)

(52) U.S. Cl.
CPC .............. *H02M 3/157* (2013.01); *H03K 5/26* (2013.01)

(58) Field of Classification Search
CPC ......... H02M 3/156; H02M 3/157; H03K 5/26
USPC ....................... 327/39, 40, 42, 100
See application file for complete search history.

(56) References Cited

U.S. PATENT DOCUMENTS

| | | | |
|---|---|---|---|
| 7,755,341 B2 | 7/2010 | Philbrick | |
| 7,944,192 B2 | 5/2011 | Moussaoui et al. | |
| 8,183,848 B2 | 5/2012 | Kuo | |
| 8,253,507 B2 | 8/2012 | Tang et al. | |
| 8,350,548 B2 | 1/2013 | Tang et al. | |
| 8,570,020 B2 | 10/2013 | Tang et al. | |
| 8,680,831 B2 | 3/2014 | Chen et al. | |
| 8,742,745 B2 | 6/2014 | Huang | |
| 9,071,135 B2 | 6/2015 | Chen et al. | |
| 9,160,229 B2 | 10/2015 | Fan et al. | |
| 9,467,043 B2 | 10/2016 | Xue et al. | |
| 10,009,019 B2 | 6/2018 | Couleur et al. | |
| 2011/0068761 A1* | 3/2011 | Chen ................. | H05B 45/3725 323/282 |
| 2021/0257998 A1* | 8/2021 | Fesler .................. | H02M 3/156 |
| 2021/0351685 A1* | 11/2021 | Sundararaj ......... | H02M 1/0009 |

(Continued)

*Primary Examiner* — William Hernandez
(74) *Attorney, Agent, or Firm* — JCIPRNET

(57) ABSTRACT

A time signal generating circuit of a power converter and a control method thereof are provided. The time signal generating circuit includes a reference frequency generating circuit, an on-time circuit and a frequency tracking circuit. The reference frequency generating circuit provides a reference frequency signal. The on-time circuit provides an on-time signal according to a first reference signal and a second reference signal. The second reference signal is related to an output voltage of the power converter. The frequency tracking circuit is coupled to the reference frequency generating circuit and the on-time circuit, and compares frequencies of the reference frequency signal and the on-time signal within a default time to generate a tracking signal. The on-time circuit adjusts the second reference signal according to the tracking signal, so that the on-time circuit adjusts the frequency of the on-time signal.

17 Claims, 5 Drawing Sheets

(56) References Cited

U.S. PATENT DOCUMENTS

2021/0376724 A1* 12/2021 Chen .................. H02M 1/08
2021/0384826 A1* 12/2021 Karadi ................ H02M 3/158

* cited by examiner

TIME SIGNAL GENERATING CIRCUIT OF POWER CONVERTER AND CONTROL METHOD THEREOF

CROSS-REFERENCE TO RELATED APPLICATION

This application claims the priority benefit of China application serial no. 201911312403.9, filed on Dec. 18, 2019. The entirety of the above-mentioned patent application is hereby incorporated by reference herein and made a part of this specification.

BACKGROUND

Technical Field

The disclosure relates to a signal generating circuit and a control method thereof, and particularly relates to a time signal generating circuit of a power converter and a control method of the time signal generating circuit.

Description of Related Art

In a general constant on-time (COT) voltage conversion system (such as a DC-to-DC converter), when the system is in a heavy-load steady state, since an on-time of the COT voltage conversion system will not change, a frequency of a pulse width modulation (PWM) signal is increased, and an extra loss caused by component parasitic resistance is increased, so that conversion efficiency of the COT voltage conversion system is decreased. Therefore, solutions of several embodiments are provided below.

SUMMARY

The disclosure is directed to a time signal generating circuit of a power converter and a control method thereof, which are adapted to generate and adjust an on-time signal.

An embodiment of the disclosure provides a time signal generating circuit of a power converter, which includes a reference frequency generating circuit, an on-time circuit and a frequency tracking circuit. The reference frequency generating circuit provides a reference frequency signal. The on-time circuit provides an on-time signal according to a first reference signal and a second reference signal. The second reference signal is related to an output voltage of the power converter. The frequency tracking circuit is coupled to the reference frequency generating circuit and the on-time circuit, and compares frequencies of the reference frequency signal and the on-time signal within a default time to generate a tracking signal. The on-time circuit adjusts the second reference signal according to the tracking signal, so that the on-time circuit adjusts the frequency of the on-time signal.

In the time signal generating circuit according to the embodiment of the disclosure, the on-time circuit includes an adjustment circuit. The adjustment circuit is coupled to the frequency tracking circuit, and generates a compensation signal according to the tracking signal to adjust the second reference signal, so that the on-time circuit adjusts the frequency of the on-time signal.

In the time signal generating circuit according to the embodiment of the disclosure, the adjustment circuit includes a plurality of current sources, and the tracking signal controls the plurality of current sources to generate the compensation signal.

In the time signal generating circuit according to the embodiment of the disclosure, the on-time circuit includes an adjustment circuit and an addition circuit. The adjustment circuit is coupled to the frequency tracking circuit and generates a compensation signal according to the tracking signal. The addition circuit adds a first digital signal related to the output voltage with the compensation signal to generate the second reference signal.

In the time signal generating circuit according to the embodiment of the disclosure, the second reference signal is an addition of the first digital signal and the compensation signal divided by a second digital signal related to an input voltage.

In the time signal generating circuit according to the embodiment of the disclosure, the frequency tracking circuit includes a first flip-flop, a second flip-flop and a counter. The first flip-flop receives the reference frequency signal and outputs a first frequency signal. The second flip-flop receives the on-time signal and outputs a second frequency signal. The counter is coupled to the first flip-flop and the second flip-flop, and generates a count value to serve as the tracking signal according to the first frequency signal and the second frequency signal within the default time.

In the time signal generating circuit according to the embodiment of the disclosure, the counter compares a rising edge of the first frequency signal and a rising edge of the second frequency signal to determine the count value.

In the time signal generating circuit according to the embodiment of the disclosure, the reference frequency generating circuit further includes a current generating circuit and a frequency generating circuit. The current generating circuit provides a base current through an external setting resistor of the power converter and an input voltage coupled to the power converter. The frequency generating circuit is coupled to the current generating circuit and generates the reference frequency signal according to the base current.

In the time signal generating circuit according to the embodiment of the disclosure, the power converter further includes an output stage and a feedback circuit. The output stage is coupled to the time signal generating circuit, and converts the input voltage into the output voltage according to the on-time signal. The feedback circuit includes an error amplifier and a comparator. The error amplifier provides an error amplification signal according to a reference voltage and a feedback voltage related to the output voltage. The comparator generates a trigger signal according to a ramp signal and the error amplification signal. The on-time circuit generates the first reference signal according to the trigger signal.

An embodiment of the disclosure provides a control method of a time signal generating circuit configured to generate an on-time signal for an output stage of a power converter to control the output stage to convert an input voltage of the power converter into an output voltage. The control method includes: providing a reference frequency signal; providing the on-time signal according to a first reference signal and a second reference signal, wherein the second reference signal is related to the output voltage; comparing frequencies of the reference frequency signal and the on-time signal in a default time to generate a tracking signal; and adjusting the second reference signal according to the tracking signal, so as to adjust the frequency of the on-time signal.

Based on the above description, the time signal generating circuit of the power converter and the control method thereof of the disclosure are capable of generating the on-time signal, and correspondingly adjusting the frequency of the on-time signal according to a load variation.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
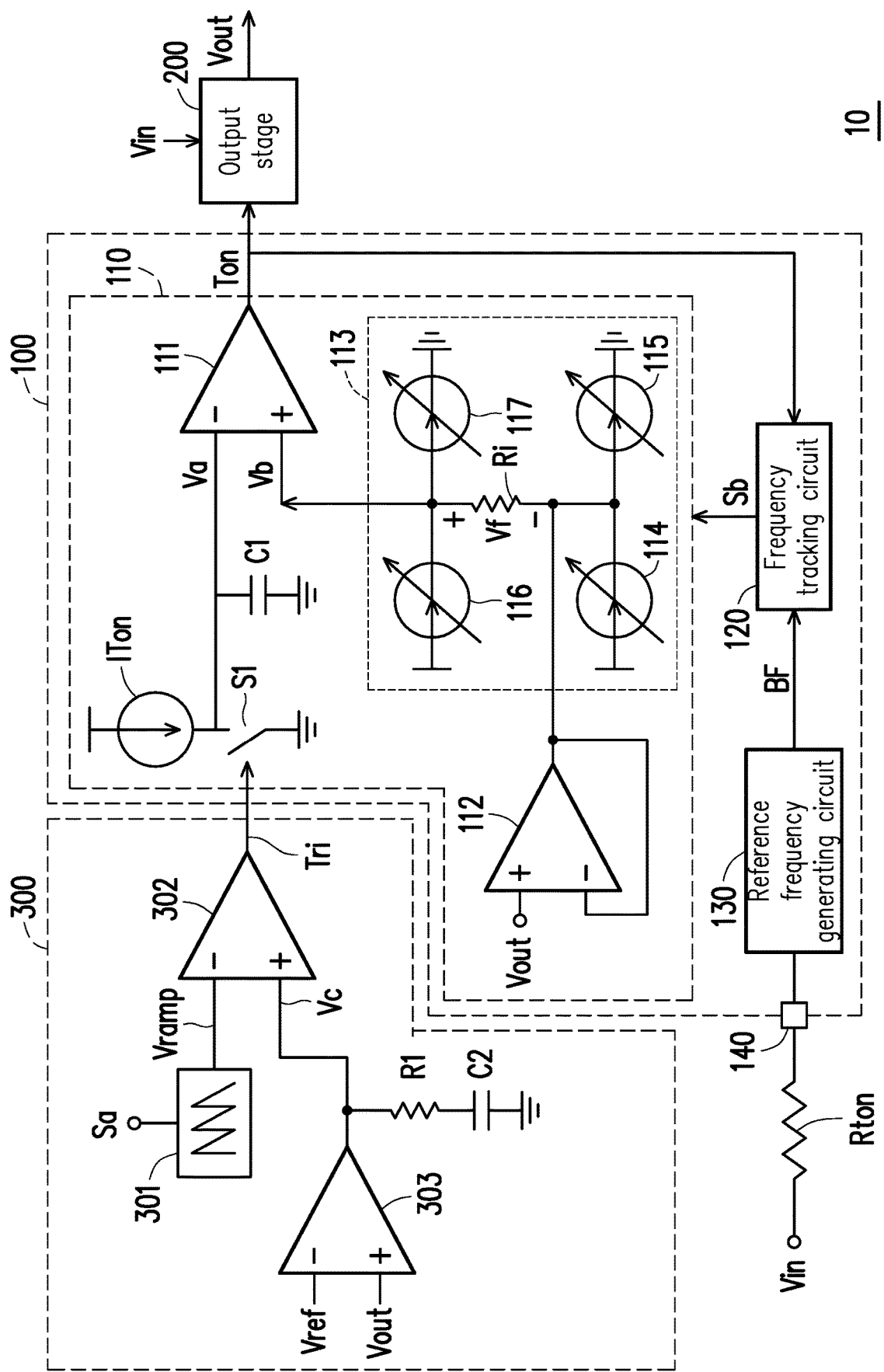
FIG. 1 is a block schematic diagram of a time signal generating circuit according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

FIG. 1 is a block schematic diagram of a time signal generating circuit of an analog type according to an embodiment of the disclosure. Referring to FIG. 1, a time signal generating circuit 100 is suitable for a control circuit in a DC-to-DC power converter 10. The time signal generating circuit 100 is used to generate an on-time signal Ton to drive an output stage 200 to provide an output voltage Vout. The DC-to-DC power converter 10 further includes the output stage 200 and a feedback circuit 300. The time signal generating circuit 100 includes an on-time circuit 110, a frequency tracking circuit 120, a reference frequency generating circuit 130 and a time-on setting terminal 140. In the embodiment, the on-time circuit 110 generates the on-time signal Ton according to the output voltage Vout, an on-time current Iion, and a tracking signal Sb. The on-time circuit 110 is coupled to the output stage 200. The on-time circuit 110 outputs the on-time signal Ton to the output stage 200 and the frequency tracking circuit 120 to control the output stage 200 to convert an input voltage Vin received by the DC-to-DC power converter 10 into the output voltage Vout. In the embodiment, the frequency tracking circuit 120 is coupled to the on-time circuit 110 and the reference frequency generating circuit 130 to receive a reference frequency signal BF provided by the reference frequency generating circuit 130 and the on-time signal Ton provided by the on-time circuit 110. The frequency tracking circuit 120 is used to provide the corresponding tracking signal Sb to the on-time circuit 110 according to the reference frequency signal BF and the on-time signal Ton, so that the on-time circuit 110 may correspondingly adjust the on-time signal Ton according to the tracking signal Sb.

The on-time circuit 110 includes a comparator 111, a voltage follower 112, an adjustment circuit 113, a switch 51, and a capacitor C1. In the embodiment, a first input terminal of the comparator 111 is coupled to one end of the switch 51, one end of the capacitor C1, and the on-time current Iion. A second input terminal of the comparator 111 is coupled to the adjustment circuit 113, and the adjustment circuit 113 is coupled to the frequency tracking circuit 120 and the voltage follower 112. When the switch 51 is not turned on, the on-time current Iion charges the capacitor C1, so that a voltage level of a first reference signal Va received by the first input terminal of the comparator 111 starts to climb. Conversely, when the switch 51 is turned on, the capacitor C1 is discharged through the switch 51, so the voltage level of the first reference signal Va received by the first input terminal of the comparator 111 drops, which makes the first reference signal Va to be a ramp signal. In the embodiment, the voltage follower 112 receives the output voltage Vout and provides the output voltage Vout to the adjustment circuit 113, so that the adjustment circuit 113 outputs a second reference signal Vb to the second input terminal of the comparator 111. The second reference signal Vb is a voltage related to the output voltage Vout.

The adjustment circuit 113 includes variable current sources 114-117 and a resistor Ri. An output terminal of the variable current source 114 and an input terminal of the variable current source 115 are coupled to a first terminal of the resistor Ri, and an output terminal of the voltage follower 112 is coupled to the first terminal of the resistor Ri. An output terminal of the variable current source 116 and an input terminal of the variable current source 117 are coupled to a second terminal of the resistor Ri, and the second terminal of the resistor Ri is coupled to the second input terminal of the comparator 111. In the embodiment, the adjustment circuit 113 may control a current provided by the variable current sources 114-117 that flows through the resistor R1 according to the tracking signal Sb, so that the resistor Ri generates a cross voltage to serve as a compensation signal Vf, which is combined with the output voltage Vout to output the second reference signal Vb to the second input terminal of the comparator 111. Therefore, the comparator 111 may compare voltage levels of the first input terminal and the second input terminal, and output the corresponding on-time signal Ton.

The switch 51 is controlled by the feedback circuit 300. The feedback circuit 300 includes a ramp signal generator 301, a comparator 302, an error amplifier 303, a resistor R1 and a capacitor C2. The ramp signal generator 301 is coupled to a first input terminal of the comparator 302. The ramp signal generator 301 receives a start signal Sa, and after the start signal Sa starts the ramp signal generator 301, the ramp signal generator 301 provides a ramp signal Vramp to the first input terminal of the comparator 302. An output terminal of the error amplifier 303 is coupled to a second input terminal of the comparator 302, and is coupled to a filter circuit formed by the resistor R1 and the capacitor C2 connected in series. A first input terminal of the error amplifier 303 receives a reference voltage Vref. A second input terminal of the error amplifier 303 receives the output voltage Vout. The output terminal of the error amplifier 303 outputs an error signal Vc to the second input terminal of the comparator 302. Therefore, the comparator 302 may determine whether to output a trigger signal Tri to turn on the switch Si according to the ramp signal Vramp and the error signal Vc.

To be specific, the on-time circuit 110 may provide the on-time signal Ton to the output stage 200 according to the output voltage Vout and the on-time current Iion of a current time point, so that the output stage 200 outputs the corresponding output voltage Vout according to the input voltage Vin and the on-time signal Ton. Then, at a next time point, if the frequency tracking circuit 120 detects that a frequency of the on-time signal Ton changes due to a load change and fails to meet a frequency of the reference frequency signal BF, the frequency tracking circuit 120 outputs an appropriate tracking signal Sb to the on-time circuit 110, so that the on-time circuit 110 may correspondingly adjust the frequency of the on-time signal Ton output at the next time point according to the tracking signal Sb, and the output stage 200 may output a new output voltage Vout according to the adjusted on-time signal Ton. Therefore, the time signal generating circuit 100 of the embodiment may effectively adjust the output voltage Vout in response to the load change, so that the power converter may maintain good power conversion efficiency under both heavy load and light load.

Figure 2:
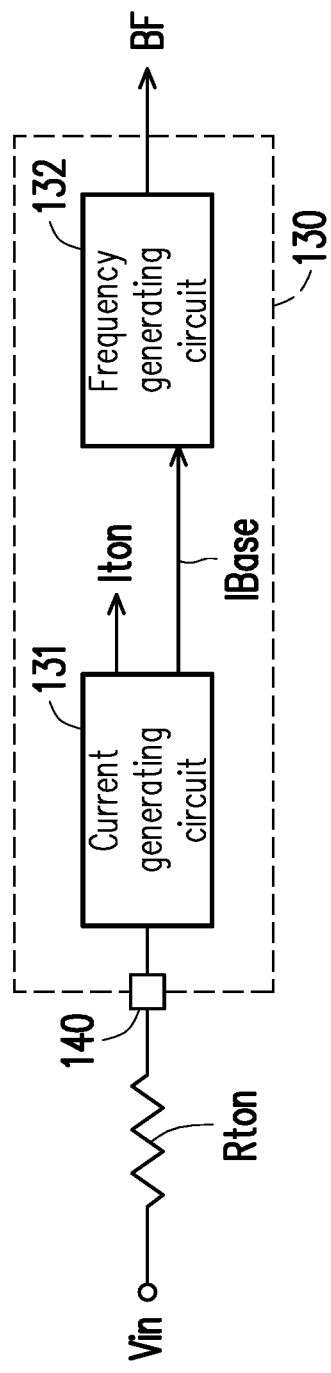
FIG. 2 is a block schematic diagram of a reference frequency generating circuit according to an embodiment of the disclosure.

FIG. 2 is a block schematic diagram of a reference frequency generating circuit according to an embodiment of the disclosure. Referring to FIG. 1 and FIG. 2, FIG. 2 is a block schematic diagram of an internal functional circuit of the reference frequency generating circuit 130 of FIG. 1. The reference frequency generating circuit 130 includes a current generating circuit 131 and a frequency generating circuit 132. The current generating circuit 131 is coupled to the frequency generating circuit 132 and coupled to the time-on setting terminal 140 of the time signal generating circuit 100. The time-on setting terminal 140 is coupled to a resistor Rton to receive the input voltage Vin. In the embodiment, the current generating circuit 131 generates the on-time current Iion to the on-time circuit 110 according to the resistor Rton and the input voltage Vin, and outputs a base current IBase to the frequency generating circuit 132. The frequency generating circuit 132 may be, for example, an LC oscillation circuit or other known oscillation components, which may provide the reference frequency signal BF to the frequency tracking circuit 120 according to the base current IBase. In the embodiment, the input voltage Vin has a fixed voltage value, and the resistor Rton has a fixed resistance value. In addition, the base current IBase provided to the frequency generating circuit 132 by the current generating circuit 131 is also fixed, so that the frequency generating circuit 132 may provide the fixed reference frequency signal BF to the frequency tracking circuit 120. Therefore, the frequency tracking circuit 120 of the embodiment may compare the frequency of the reference frequency signal BF and the frequency of the on-time signal Ton to effectively determine whether the on-time is changed due to a load change.

Figure 3:
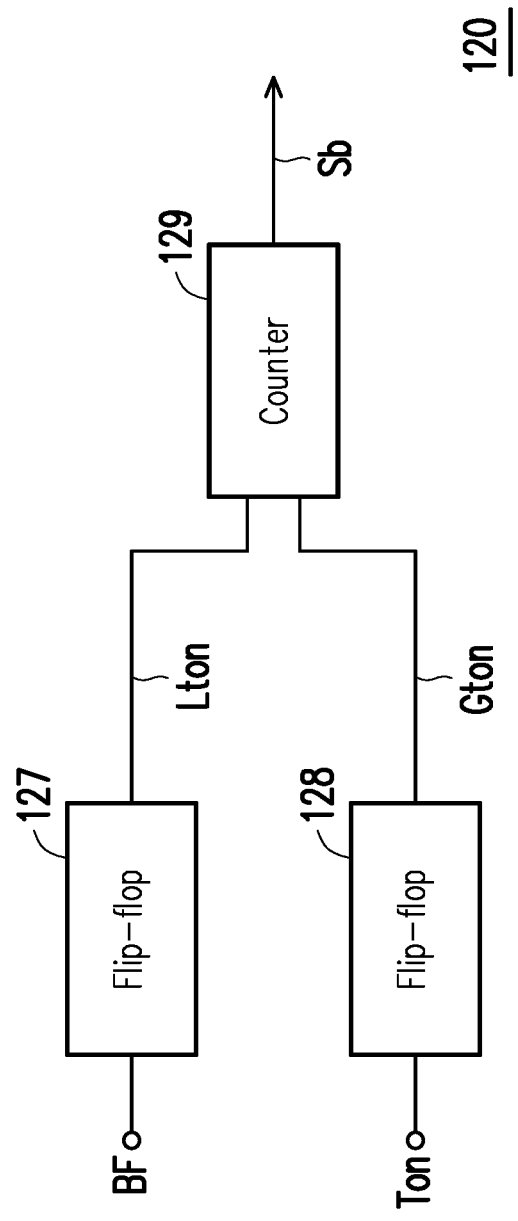
FIG. 3 is a block schematic diagram of a frequency tracking circuit according to an embodiment of the disclosure.

FIG. 3 is a block schematic diagram of a frequency tracking circuit according to an embodiment of the disclosure. Referring to FIG. 1 and FIG. 3, FIG. 3 is a block schematic diagram of an internal functional circuit of the frequency tracking circuit 120 of FIG. 1. In the embodiment, the frequency tracking circuit 120 includes flip-flops 127 and 128 and a counter 129. The flip-flops 127 and 128 are coupled to the counter 129, and the flip-flops 127 and 128 are respectively edge detectors. The flip-flop 127 receives the reference frequency signal BF provided by the reference frequency generating circuit 130, and the flip-flop 128 receives the on-time signal Ton provided by the on-time circuit 110. The flip-flop 127 is used to correspondingly output a frequency signal Lton when the reference frequency signal BF has a transition. The flip-flop 128 is used to correspondingly output a frequency signal Gton when the on-time signal Ton has a transition. In addition, the counter 129 may generate a count value to serve as the tracking signal Sb according to the frequency signals Lton and Gton within a default time. It should be noted that the counter 129 of the embodiment determines the count value by comparing rising edges of the frequency signals Lton and Gton.

For example, if the counter 129 receives the frequency signal Gton first, it means that the frequency of the on-time signal Ton is greater than that of the reference frequency signal BF, so that the counter 129 adds the count value by 1. Since the count value is increased by 1 to increase the tracking signal Sb, the adjustment circuit 113 may output the compensation signal Vf for increasing the output voltage Vout received by the on-time circuit 110. Conversely, if the counter 129 receives the frequency signal Lton first, it means that the frequency of the on-time signal Ton is lower than that of the reference frequency signal BF, so that the counter 129 reduces the count value by 1. Since the count value is reduced by 1 to reduce the tracking signal Sb, the adjustment circuit 113 outputs the compensation signal Vf for reducing the output voltage Vout received by the on-time circuit 110. It should be noted that the counter 129 is an up/down counter, which only increases or decreases one bit of the count value or maintains the count value in one counting cycle. In other words, the frequency tracking circuit 120 of the embodiment outputs the tracking signal Sb in a fine-tuning manner, so that the on-time circuit 110 may correspondingly fine-tune the on-time signal Ton according to the tracking signal Sb, by which the on-time signal Ton may be effectively compensated to achieve a frequency tracking effect of maintaining the frequency of the on-time signal Ton.

Figure 4:
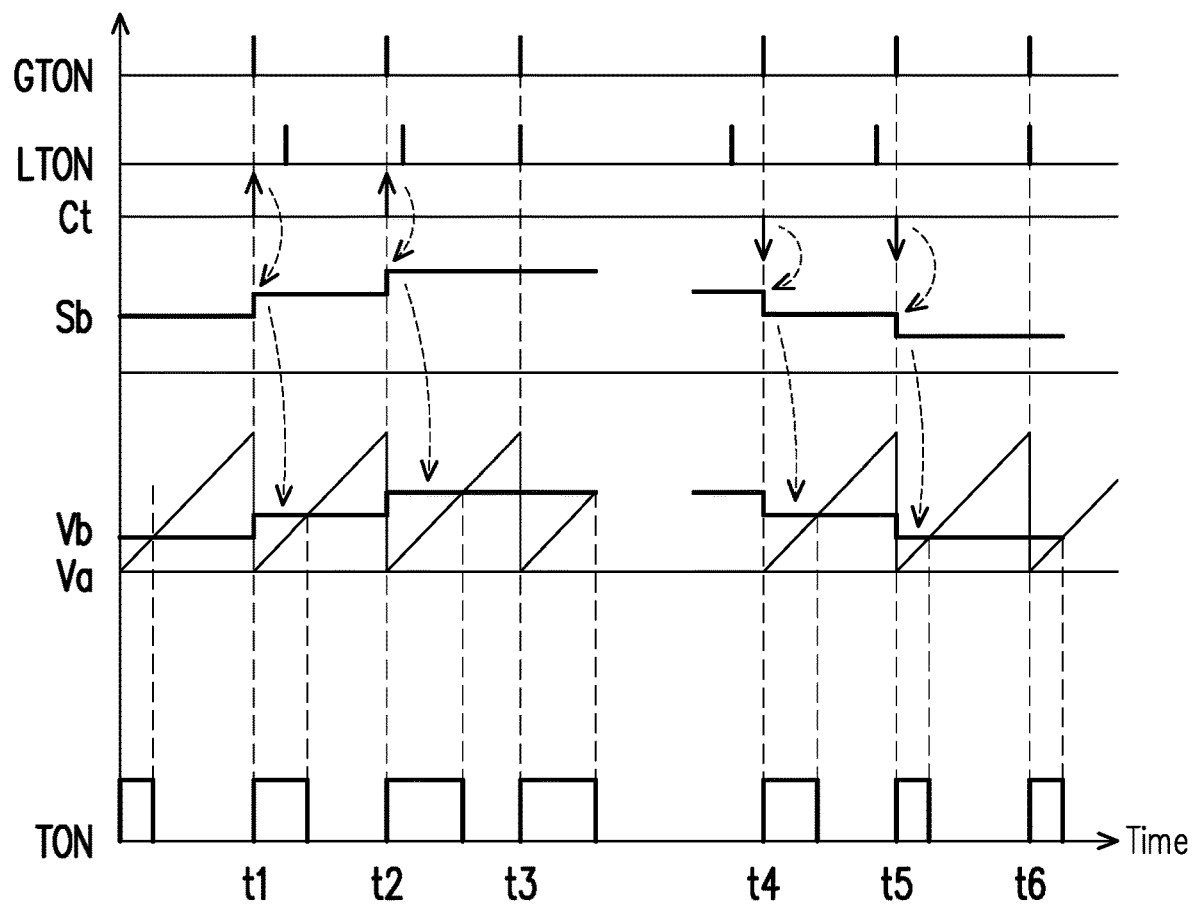
FIG. 4 is a signal timing diagram of a plurality of signals according to an embodiment of the disclosure.

FIG. 4 is a signal timing diagram of a plurality of signals according to an embodiment of the disclosure. Referring to FIG. 1, FIG. 3 and FIG. 4, the comparator 111 compares the first reference signal Va and the second reference signal Vb to output the on-time signal Ton. The first reference signal Va is a ramp signal. To be specific, when the second reference signal Vb is higher than the first reference signal Va, the comparator 111 outputs the on-time signal Ton. The on-time signal Ton is a square wave signal. In the embodiment, when the up/down counter 129 of FIG. 3 first receives the frequency signal Gton at a time point t1, a counting operation Ct of the up/down counter 129 is to increase the count value by one bit (for example, 87+1=88). Then, the tracking signal Sb operates the variable current sources 115 and 116 in the adjustment circuit 113 to turn on to generate the compensation signal Vf of a positive voltage (for example, Vf=+Vout/256). In this regard, the second input terminal of the comparator 111 may receive the second reference signal Vb, and the second reference signal Vb is the output voltage Vout plus the compensation signal Vf (for example, Vb=Vout+Vf). Therefore, the comparator 111 may adjust a pulse width of the on-time signal Ton according to the second reference signal Vb to output the extended on-time signal Ton. Since a dead zone time of the output stage 200 is fixed, i.e., extension of the pulse width of the on-time signal Ton may reduce the frequency of the on-time signal Ton. It should be noted that the compensation signal Vf is an n-th power of the output voltage Vout divided by 2, and n is an integer greater than or equal to zero. Similarly, at a time point t2, if the up/down counter 129 still receives the frequency signal Gton first, the comparator 111 further increases the count value by one bit (for example, 88+1=89), such that the adjustment circuit 113 provides the compensation signal Vf of a positive voltage (for example, Vf=+2Vout/256) to again adjust the second reference signal Vb, and again extend the pulse width of the on-time signal Ton. Until the up/down counter 129 receives the frequency signals Lton and Gton simultaneously at a time point t3 or at similar time points, the up/down counter 129 maintains the count value (such as 89) to maintain the compensation signal Vf (for example, maintained to Vf=+2Vout/256) and the pulse width of the on-time signal Ton.

Comparatively, when the up/down counter 129 of FIG. 3 first receives the frequency signal Lton at a time point t4, the counting operation Ct of the up/down counter 129 is to decrease the count value by one bit (for example, 87−1=86). Then, the tracking signal Sb operates the variable current sources 114 and 117 to turn on to provide the compensation signal Vf of a negative voltage (for example, Vf=−Vout/256). In this way, the second input terminal of the comparator 111 may receive the second reference signal Vb, and the second reference signal Vb is the output voltage Vout plus the compensation signal Vf (for example, Vb=Vout+Vf). Therefore, the comparator 111 may adjust the pulse width of the on-time signal Ton according to the second reference signal Vout', so as to output the shortened on-time signal Ton, i.e., to increase the frequency of the on-time signal Ton. Similarly, at a time point t5, if the up/down counter 129 still receives the frequency signal Lton first, the comparator 111 may further decrease the count value by one bit (for example, 86−1=85), so that the adjustment circuit 113 provides the compensation signal Vf of a negative voltage (for example, Vf=−2Vout/256) to again adjust the second reference signal Vout', and again shorten the pulse width of the on-time signal Ton. Until the up/down counter 129 receives the frequency signals Lton and Gton simultaneously at a time point t6 or at similar time points, the up/down counter 129 maintains the count value (such as 85) to maintain the compensation signal Vf (for example, maintained to Vf=−2Vout/256) and the pulse width of the on-time signal Ton.

Figure 5:
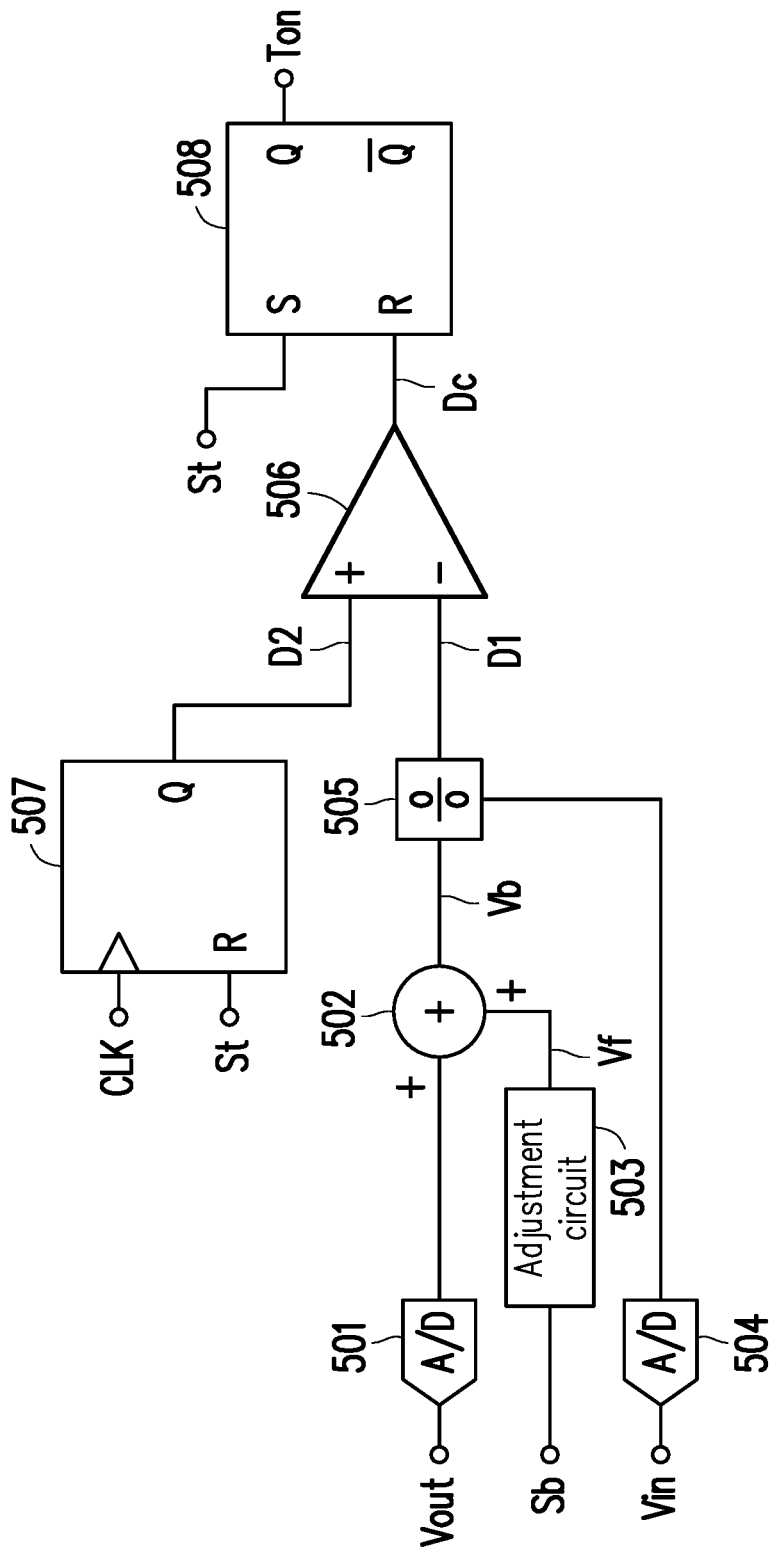
FIG. 5 is a schematic diagram of an on-time circuit of a digital type according to an embodiment of the disclosure.

FIG. 5 is a schematic diagram of an on-time circuit of a digital type according to an embodiment of the disclosure. FIG. 5 is a digital system structural diagram of the on-time circuit 110 of FIG. 1. Referring to FIG. 5, the on-time circuit 110 includes analog-to-digital converters 501 and 504, an addition circuit 502, an adjustment circuit 503, a divider 505, a comparator 506, an up counter 507, and a flip-flop 508. In the embodiment, the analog-to-digital converter 501 receives the output voltage Vout to output a first digital signal to the addition circuit 502. The adjustment circuit 503 receives the tracking signal Sb to generate the compensation signal Vf to the addition circuit 502. Therefore, the addition circuit 502 adds the first digital signal related to the output voltage Vout and the compensation signal Vf to generate the second reference signal Vb to the divider 505. Therefore, the second reference signal Vb is an addition of the first digital signal and the compensation signal Vf divided by a second digital signal related to the input voltage Vin. The divider 505 divides the second reference signal Vb by the input voltage Vin, and may, for example, multiply another frequency signal or other digital signals to output a reference signal D1 based on the output voltage to an inverting input terminal of the comparator 506. A frequency input terminal of the up counter 507 receives a frequency signal CLK, and a reset terminal R of the up counter 507 receives a trigger signal St. In the embodiment, the up counter 507 is used to output a voltage signal D2 simulating a ramp signal to a non-inverting input terminal of the comparator 506 according to the frequency signal CLK and the trigger signal St. Therefore, when the voltage signal D2 is increased to a value of the reference signal D1, an output terminal of the comparator 506 outputs a high-level comparison signal Dc to a reset terminal R of the flip-flop 508. A setting terminal S of the flip-flop 508 receives the trigger signal St. Therefore, the flip-flop 508 may output the on-time Ton via an output terminal Q according to the trigger signal St and the digital comparison signal Dc. The trigger signal St may be the trigger signal Tri generated by the feedback circuit 300 in FIG. 1.

Figure 6:
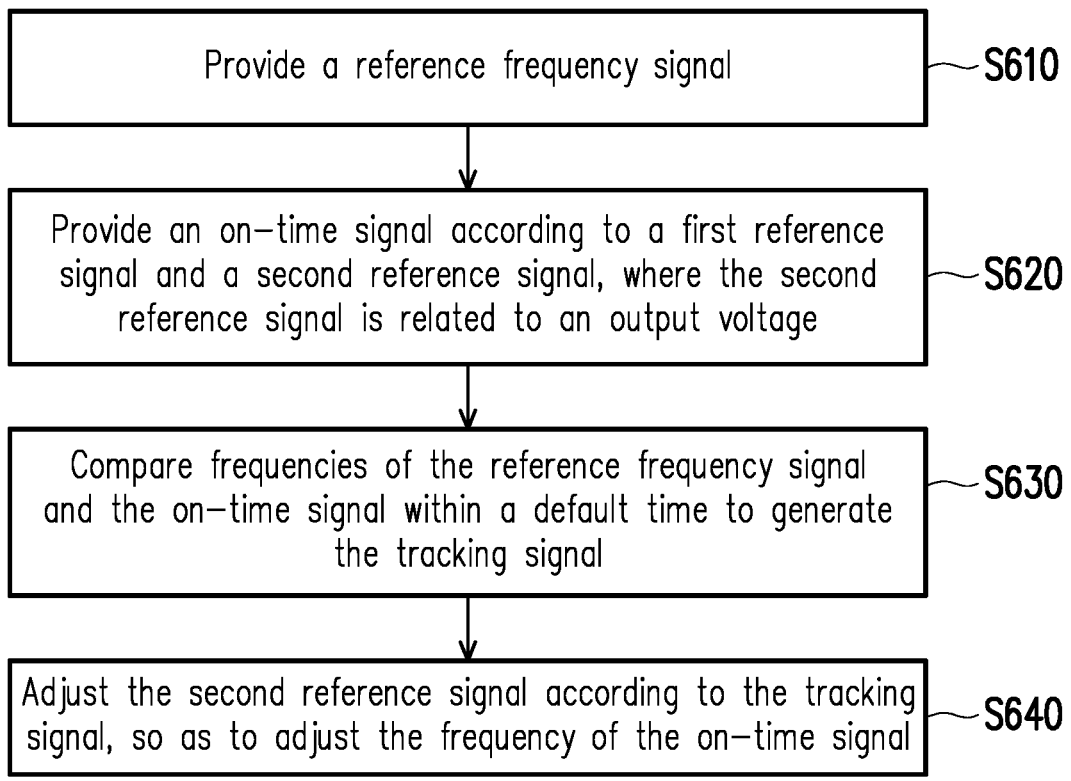
FIG. 6 is a flowchart illustrating a method for adjusting an on-time signal according to an embodiment of the disclosure.

FIG. 6 is a flowchart illustrating a method for adjusting an on-time signal according to an embodiment of the disclosure. Referring to FIG. 1 and FIG. 6, the method for adjusting the on-time signal of the disclosure may be applied to the time signal generating circuit 100 of the embodiment of FIG. 1. In step S610, the reference frequency generating circuit 130 provides the reference frequency signal BF to the frequency tracking circuit 120. In step S620, the on-time circuit 110 provides the on-time signal Ton to the output stage 200 and the frequency tracking circuit 120 according to the first reference signal Va and the second reference signal Vb, where the second reference signal Vb is related to the output voltage Vout. The output stage 200 generates the output voltage Vout according to the on-time signal Ton. In step S630, the frequency tracking circuit 120 compares the frequencies of the reference frequency signal BF and the on-time signal Ton within the default time to generate the tracking signal Sb. In step S640, the on-time circuit 110 adjusts the second reference signal Vb according to the tracking signal Sb, so as to adjust the frequency of the on-time signal Ton. Therefore, the control method of the time signal generating circuit of the embodiment may adjust the pulse width of the on-time signal Ton in real time according to the comparison result of the frequencies of the on-time signal Ton and the reference frequency signal BF, so as to maintain the frequency of the on-time signal Ton.

Moreover, regarding the relevant circuit features, implementation and technical details of the time signal generating circuit 100 of the embodiment, reference may be made to the description of the above-mentioned embodiments of FIG. 1 to FIG. 5 for adequate instructions, recommendations and implementation descriptions, and details thereof are not repeated.

In summary, the time signal generating circuit of the power converter and the control method thereof of the disclosure are capable of adjusting the frequency of the on-time signal to track the on-time signal in response to a load change, so that the power converter may maintain good power conversion efficiency under both heavy load and light load.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:
1. A time signal generating circuit of a power converter, comprising:
a reference frequency generating circuit, providing a reference frequency signal;
an on-time circuit, providing an on-time signal according to a first reference signal and a second reference signal, wherein the second reference signal is related to an output voltage of the power converter; and a frequency tracking circuit, coupled to the reference frequency generating circuit and the on-time circuit, and comparing frequencies of the reference frequency signal and the on-time signal within a default time to generate a tracking signal, wherein the on-time circuit adjusts the second reference signal according to the tracking signal, so that the on-time circuit adjusts the frequency of the on-time signal.

2. The time signal generating circuit as claimed in claim 1, wherein the on-time circuit comprises:

an adjustment circuit, coupled to the frequency tracking circuit, and generating a compensation signal according to the tracking signal to adjust the second reference signal, so that the on-time circuit adjusts the frequency of the on-time signal.

3. The time signal generating circuit as claimed in claim 2, wherein the adjustment circuit comprises a plurality of current sources, and the tracking signal controls the plurality of current sources to generate the compensation signal.

4. The time signal generating circuit as claimed in claim 1, wherein the on-time circuit comprises:

an adjustment circuit, coupled to the frequency tracking circuit, and generating a compensation signal according to the tracking signal; and an addition circuit, adding a first digital signal related to the output voltage with the compensation signal to generate the second reference signal.

5. The time signal generating circuit as claimed in claim 4, wherein the second reference signal is an addition of the first digital signal and the compensation signal divided by a second digital signal related to an input voltage.

6. The time signal generating circuit as claimed in claim 1, wherein the frequency tracking circuit comprises:

a first flip-flop, receiving the reference frequency signal, and outputting a first frequency signal;

a second flip-flop, receiving the on-time signal, and outputting a second frequency signal; and a counter, coupled to the first flip-flop and the second flip-flop, and generating a count value to serve as the tracking signal according to the first frequency signal and the second frequency signal within the default time.

7. The time signal generating circuit as claimed in claim 6, wherein the counter compares a rising edge of the first frequency signal and a rising edge of the second frequency signal to determine the count value.

8. The time signal generating circuit as claimed in claim 6, wherein the counter gradually increases or decreases one bit of the count value, or maintains the count value.

9. The time signal generating circuit as claimed in claim 1, wherein the reference frequency generating circuit further comprises:

a current generating circuit, providing a base current through an external setting resistor of the power converter and an input voltage coupled to the power converter; and a frequency generating circuit, coupled to the current generating circuit and generating the reference frequency signal according to the base current.

10. The time signal generating circuit as claimed in claim 1, wherein the power converter further comprises:

an output stage, coupled to the time signal generating circuit, and converting an input voltage into the output voltage according to the on-time signal; and a feedback circuit, comprising an error amplifier and a comparator, wherein the error amplifier provides an error amplification signal according to a reference voltage and a feedback voltage related to the output voltage, the comparator generates a trigger signal according to a ramp signal and the error amplification signal, and the on-time circuit generates the first reference signal according to the trigger signal.

11. A control method of a time signal generating circuit, configured to generate an on-time signal for an output stage of a power converter to control the output stage to convert an input voltage of the power converter into an output voltage, the control method comprising:

providing a reference frequency signal;

providing the on-time signal according to a first reference signal and a second reference signal, wherein the second reference signal is related to the output voltage;

comparing frequencies of the reference frequency signal and the on-time signal within a default time to generate a tracking signal; and adjusting the second reference signal according to the tracking signal, so as to adjust the frequency of the on-time signal.

12. The control method as claimed in claim 11, wherein the step of adjusting the second reference signal according to the tracking signal further comprises:

controlling a plurality of current sources according to the tracking signal to generate a compensation signal to adjust the second reference signal.

13. The control method as claimed in claim 11, wherein the step of adjusting the second reference signal according to the tracking signal comprises:

adding a first digital signal related to the output voltage and a compensation signal generated according to the tracking signal to generate the second reference signal.

14. The control method as claimed in claim 13, wherein in the step of adjusting the second reference signal according to the tracking signal, the second reference signal is an addition of the first digital signal and the compensation signal divided by a second digital signal related to the input voltage.

15. The control method as claimed in claim 11, wherein the step of comparing the frequencies of the reference frequency signal and the on-time signal within the default time further comprises:

receiving the reference frequency signal, and outputting a first frequency signal;

receiving the on-time signal, and outputting a second frequency signal;

generating a count value according to the first frequency signal and the second frequency signal within the default time; and taking the count value as the tracking signal.

16. The control method as claimed in claim 15, wherein the step of generating the count value according to the first frequency signal and the second frequency signal within the default time comprises:

comparing a rising edge of the first frequency signal and a rising edge of the second frequency signal to determine the count value.

17. The control method as claimed in claim 15, wherein the step of generating the count value comprises:

gradually increasing or decreasing one bit of the count value, or maintaining the count value.

\* \* \* \* \*